United States Patent [19]

Rode

[11] Patent Number: 4,727,406
[45] Date of Patent: Feb. 23, 1988

[54] PRE-MULTIPLEXED DETECTOR ARRAY

[75] Inventor: Jonathan P. Rode, Thousand Oaks, Calif.

[73] Assignee: Rockwell International Corporation, El Segundo, Calif.

[21] Appl. No.: 348,398

[22] Filed: Feb. 12, 1982

[51] Int. Cl.⁴ .............................................. H01L 27/14
[52] U.S. Cl. ...................................... 357/30; 357/51; 357/32; 357/31
[58] Field of Search .................. 357/30, 32, 31, 30 G, 357/30 H, 50, 40, 51, 23.6

[56] References Cited

U.S. PATENT DOCUMENTS

| | | | |
|---|---|---|---|
| Re. 27,775 | 10/1973 | Lehovec | 357/23 C X |
| 3,411,053 | 11/1968 | Wiesner | 357/23 C X |
| 3,560,815 | 2/1971 | Sigsbee | 357/23 C X |
| 3,808,472 | 4/1974 | Engeler | 357/23 C |
| 3,890,631 | 6/1975 | Tiemann | 357/23 C X |
| 3,911,467 | 10/1975 | Levine et al. | 357/30 X |
| 3,932,775 | 1/1976 | Kosonocky | 357/30 X |
| 3,988,613 | 10/1976 | Brown et al. | 357/30 X |
| 4,012,587 | 3/1977 | Ochi et al. | 357/30 X |
| 4,081,841 | 3/1978 | Ochi et al. | 358/213 |
| 4,212,034 | 7/1980 | Kokie et al. | 358/213 |
| 4,223,330 | 9/1980 | Koike et al. | 357/30 X |
| 4,228,365 | 10/1980 | Gutierrez et al. | 357/30 X |

Primary Examiner—Andrew J. James
Assistant Examiner—William A. Mintel
Attorney, Agent, or Firm—H. Fredrick Hamann; Craig O. Malin; John J. Deinken

[57] ABSTRACT

Disclosed is a detector array for sensing electromagnetic radiation, which is based upon a semiconducting layer of a first conductivity type with an array of junction regions of a second conductivity type located in a major surface thereof. A first insulating layer is deposited over the major surface, and a plurality of conducting plates is disposed on the first insulating layer around each junction region. Each conducting plate creates an induced junction in the semiconducting layer upon the application of an electrical potential between the plate and the semiconducting layer. A second insulating layer is deposited over the plates and the first insulating layer, with a contact through the first and second insulating layers associated with each junction region. Each conducting plate is connected to a control line deposited over the second insulating layer for selectively applying the potential to that plate. A third insulating layer is deposited over the device, with an opening through that layer to each of the contacts.

7 Claims, 14 Drawing Figures

PRE-MULTIPLEXED DETECTOR ARRAY

BACKGROUND OF THE INVENTION

This invention relates to solid state focal planes which form an image of a scene by detecting the light emanating from the scene.

Advanced imaging systems have recently been the subject of considerable research and development, particularly in the field of infrared detection. These systems employ a focal plane, which is an integrated device incorporating a large array of light-sensitive detectors and appropriate electronic components to process the signals generated by the detectors. Two basic approaches, monolithic and hybrid, have been followed in designing infrared focal planes. A monolithic focal plane is fabricated with the multiplexer forming an integral part of the detector structure, while the photodetector array and the signal multiplexer of a hybrid focal plane are manufactured as separate components, then joined together using an advanced interconnection technology (See, e.g., U.S. Pat. No. 4,067,104).

Whether the monolithic or hybrid configuration is chosen for a particular application, the focal plane must accomplish the complementary functions of photon detection, including prefiltering of the optical signal, and signal multiplexing. Photon detection can be achieved in either intrinsic or extrinsic semiconductors, by using either photovoltaic, photoconductive, or MIS (metal-insulator-semiconductor) detectors. Detection can also be implemented through internal photoemission over a Schottky barrier or with pyroelectrics. The detectors can be either frontside or backside illuminated and, for hybrid arrays, where the sensed charge from the detectors is coupled into the CCD multiplexer for readout, the interface can be either source coupled or gate coupled. Multiplexing can be achieved by x-y addressed MOSFETs, a charge transfer device, or charge injection.

Some of the early focal plane designs utilized a linear array of detectors which was physically scanned over a scene to obtain a two dimensional image. The advantages of a two dimensional staring focal plane, however, have been well established and include a long integration time, leading to a favorable mean resolution temperature, and the elimination of the increased complexity and reduced reliability introduced by a scanning mechanism. The maximum number of pixels which can be included in a staring focal plane, however, has been limited in the past by the number of detectors which may be included on the focal plane. The number of possible detectors has, in turn, been relatively low, approximately $10^3$–$10^4$ as compar scene which contains approximately $2 \times 10^5$ pixels. In a hybrid focal plane, this pixel limitation results from a combination of constraints. First, neither a silicon multiplexer input cell nor a hybrid interconnect can be reduced in size below approximately $50 \times 50$ $\mu m^2$. Although further research may ultimately achieve sizes as small as $25 \times 25$ $\mu m^2$ for these elements of the design, the detectors themselves can be made even smaller. Second, the overall size of a hybrid array is limited both by the yield of the silicon multiplexer chip and the differential thermal expansion between silicon and the detector material (InAsSb or HgCdTe, for example, in the case of an infrared detector) to approximately $1 \times 1$ cm$^2$.

Because of these constraints on multiplexer cell size, interconnect size, and overall chip size, an array of detectors can be made with a center-to-center spacing much smaller than the spacing of the highest density focal plane which is available. Consequently, a need has developed for a multiplexing scheme which would enable several detectors to be connected to each input cell of the multiplexer. If, for example, the focal plane unit cell were $50 \times 50$ $\mu m^2$ and each detector $25 \times 25$ $\mu m^2$, the unit cells could be multiplexed to receive input for 25% of the viewing cycle from each of four detectors, thereby increasing the number of pixels for the imaging system by a factor of four.

SUMMARY OF THE INVENTION

It is a general objective of this invention to provide an improved detector array for sensing electromagnetic radiation.

In a first embodiment, the array of this invention is formed on a semiconducting layer of a first conductivity type which is provided with an array of junction regions of a second conductivity type. A plurality of capacitive elements are arranged around each junction region in order to create a plurality of induced junction regions adjoining the junction region. Each capacitive element is connected to a control line for selectively creating the induced junction regions. This selectivity establishes a partial or pre-multiplexing function in the semiconducting layer.

In an alternative embodiment, the array additionally includes an auxiliary junction region of the second conductivity type located in the semiconducting layer next to each induced junction region, so that each induced junction region connects an auxiliary junction region to the adjoining junction region.

In a more particular embodiment, an insulating layer is disposed over the semiconducting layer, with the capacitive elements each including a conducting plate on the insulating layer. Each plate forms, in conjunction with the insulating layer and the semiconducting layer, an MIS (Metal-Insulator-Semiconductor) capacitor.

In a detailed embodiment, an array of junction regions of a second conductivity type is located in a major surface of a semiconducting layer having a first conductivity type. A first insulating layer is deposited over the major surface, with a plurality of conducting plates disposed on the first insulating layer around each junction region for creating, upon the application of an electrical potential between each plate and the semiconducting layer, an induced junction region in the semiconducting layer and adjoining the junction region. A second insulating layer is deposited over the conducting plates and the first insulating layer, with a contact formed through the first and second insulating layers for each junction region. A plurality of control lines are disposed over the second insulating layer, each conducting plate being connected to a control line for selectively applying the aforementioned electrical potential to the plate. A third insulating layer is deposited over the control lines, the contacts, and the second insulating layer, with an opening through the third layer over each of the contacts.

The invention also provides a method of making a detector array, which begins with a semiconducting layer of a first conductivity type, in which is formed an array of junction regions of a second conductivity type. An array of capacitive elements is then established around each junction for creating a plurality of induced junction regions adjoining the junction region. A plurality of control lines are formed over the layer and each capacitive element is connected to a control line to enable the selective creation of the induced junction regions.

In a more detailed embodiment, the method starts with a semiconducting layer of a first conductivity type. An array of junction regions of a second conductivity type is formed in a major surface of the semiconducting layer and a first insulating layer is deposited over the major surface. The first insulating layer is then opened over each junction region and a first metal layer is deposited. The first metal layer is masked to selectively etch it, thereby defining a plurality of conducting plates around each junction region and leaving metal in the opening over each junction region. Next, a second insulating layer is deposited over the first metal layer, the second insulating layer is opened over each junction region and each conducting plate, and a second metal layer is deposited. This metal layer is masked and etched to define a contact over each junction region and to define a plurality of control lines such that each conducting plate is connected to a control line. Finally, a third insulating layer is deposited and opened over each contact to facilitate connecting the detector array to a multiplexer array.

BRIEF DESCRIPTION OF THE DRAWINGS

Additional objectives, features, and advantages of the invention are discussed in the detailed description below, which is supplemented by the drawings, where.

DETAILED DESCRIPTION OF THE INVENTION

The present invention enables the signals from the detector array of a hybrid focal plane to be partially multiplexed on the detector chip prior to the transfer of those signals to the signal multiplexing chip, thereby significantly increasing the maximum number of pixels which may be employed in such an array, leading to improved resolution and a wider field of view for the focal plane.

The structure and operation of this invention can be described most effectively by first discussing the method in which a detector array can be fabricated according to the invention. FIGS. 1-12 illustrate the sequence of steps which may be followed in the process, with the odd numbered figures showing a plan view of a portion of the device and the even numbered figures a corresponding cross-sectional side view of the device.

Figure 1:
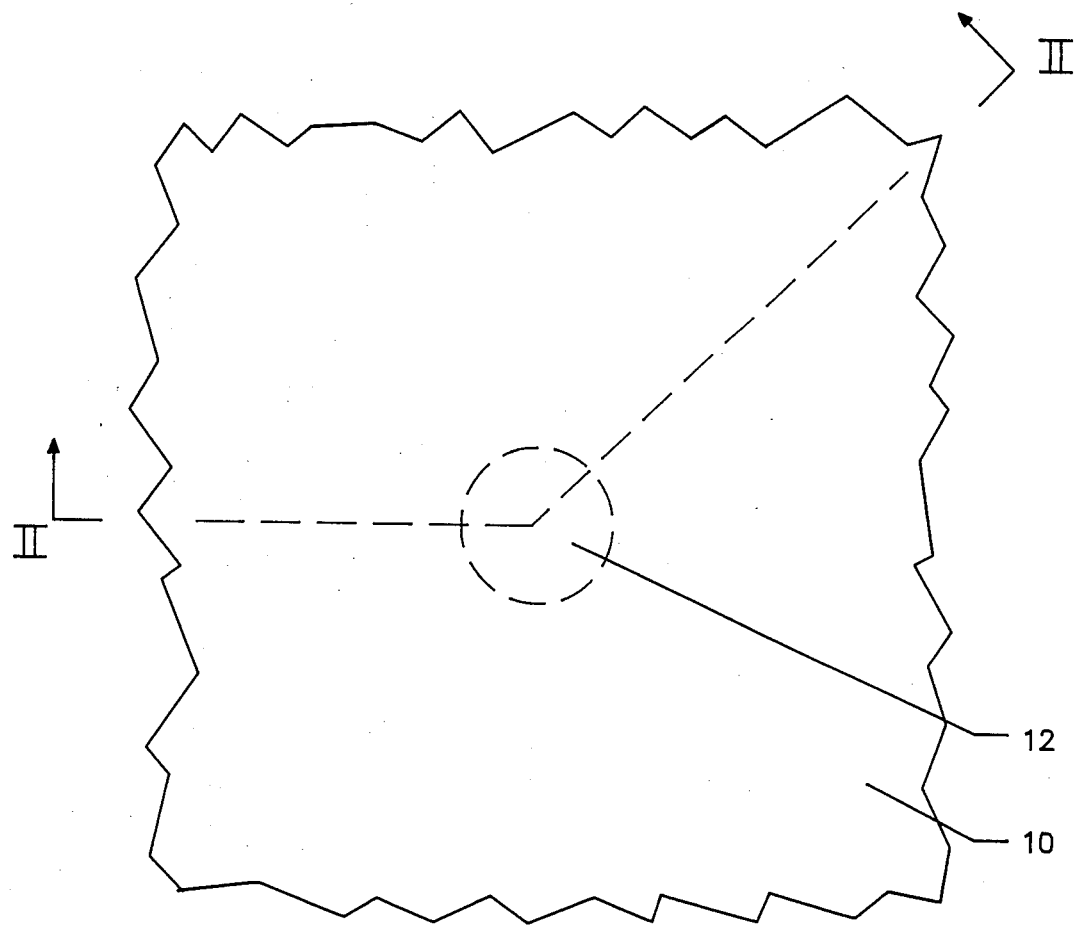
FIGS. 1, 3, 5, 7, 9, and 11 are plan views illustrating successive steps in the method of making a detector array according to the present invention.
Figure 2:
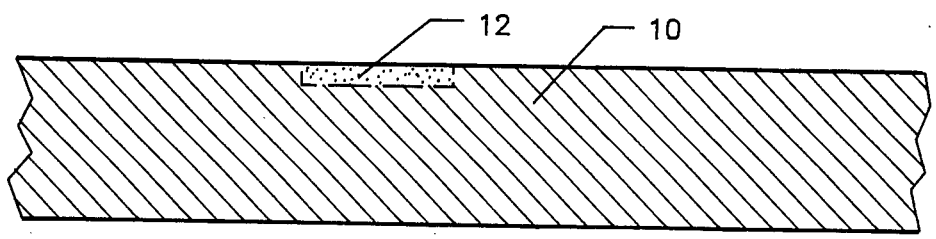
FIGS. 2, 4, 6, 8, 10, and 12 are cross-sectional side views corresponding to FIGS. 1-11, FIGS. 11 and 12 depicting a portion of a completed detector array.

The process begins with the selection of a semiconducting layer 10, as shown in FIGS. 1 and 2. This material is chosen according to the wavelength of the radiation which is to be detected. In the case of infrared radiation, for example, an appropriate choice would be $Hg_{1-x}Cd_xTe$ with x equal to 0.29. The basic material conductivity type in this case is p, with a doping density of $10^{15}$–$10^{16}$ cm$^{-3}$. In the preferred embodiment, the layer 10 is grown epitaxially to a thickness of 15 μm on a transparent substrate (which is not shown). This technique permits backside illumination of the device, so that the processing and signal multiplexing circuits do not obscure the incoming radiation. The layer 10 is masked to define an array of junction regions, such as the junction region 12, in the surface of the layer 10. The junction regions are doped to an opposite conductivity, i.e., n type junctions are formed. This doping may be accomplished by techniques known in the art, such as ion implantation of B or diffusion of Hg.

Figure 3:
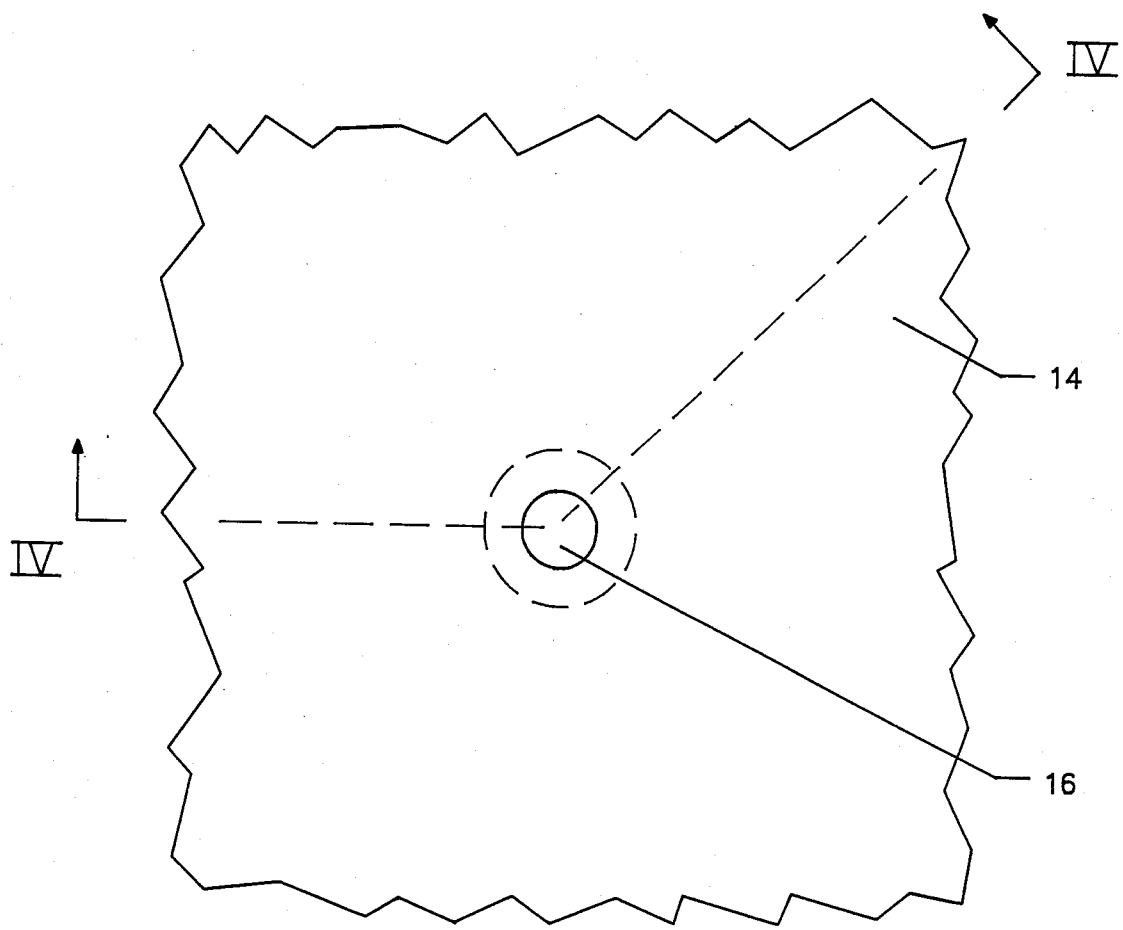
Figure 4:
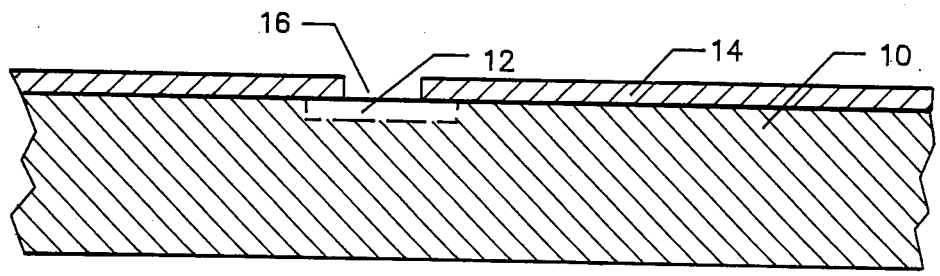

Next, a first level of insulation 14 is deposited over the surface of the layer 10, as shown in FIGS. 3 and 4. (FIG. 4 is a cross-sectional side view along the line IV—IV of FIG. 3.) The insulating layers for this device may be fabricated by evaporating ZnS or photo-depositing $SiO_2$. The insulation 14 is removed over each junction region, as in the area 16, and first level metal is deposited.

Figure 5:
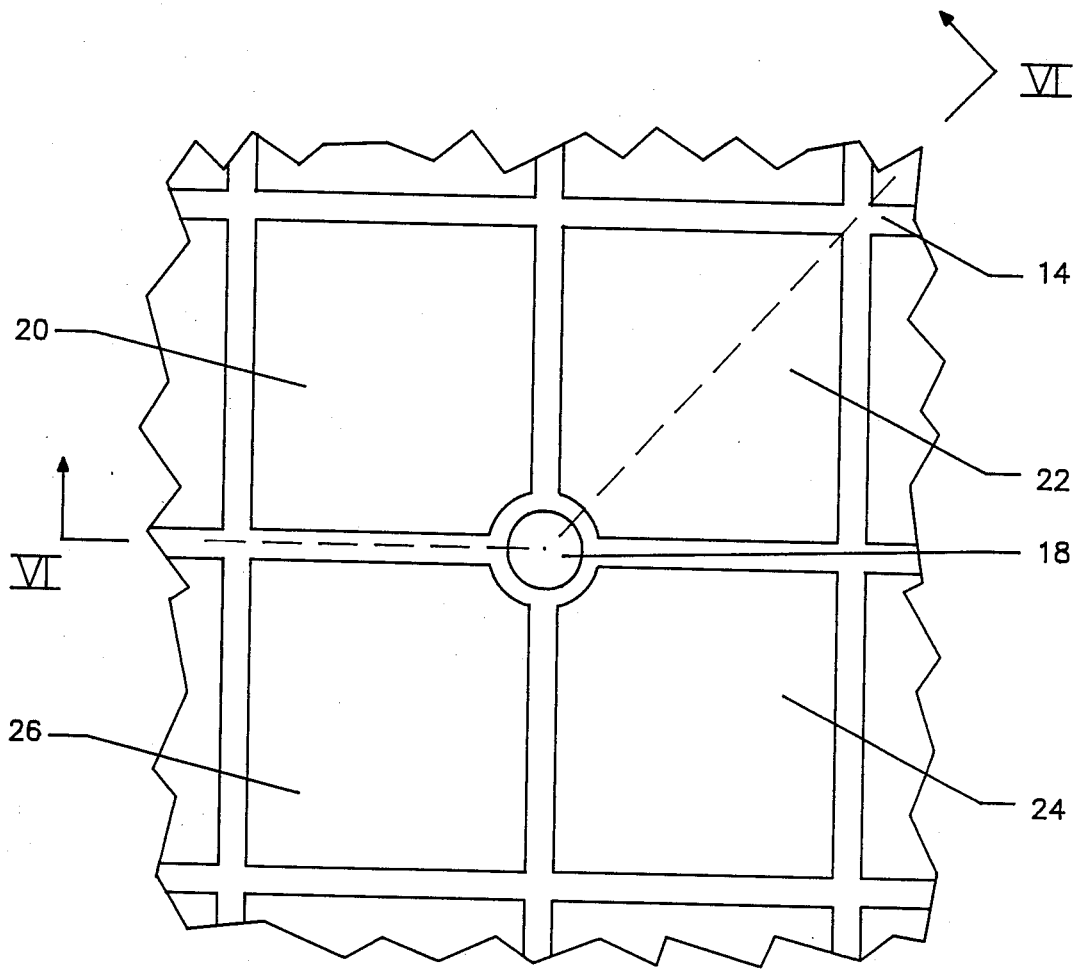
Figure 6:
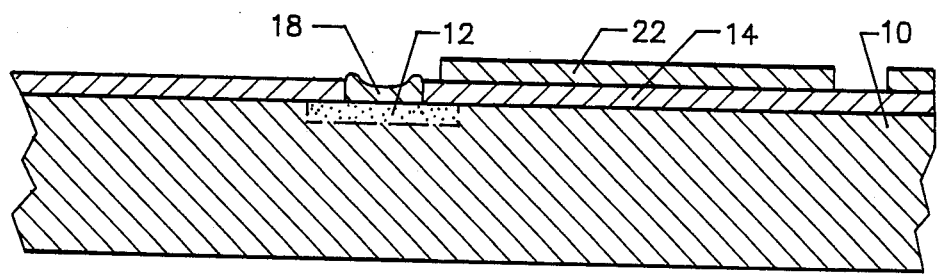

A mask is then used to etch the first level metal, as shown in FIGS. 5 and 6, thereby defining contacts over each junction region, such as the contact 18, and defining a number of conducting plates, such as the conducting plates 20, 22, 24, and 26, around each junction region.

Figure 7:
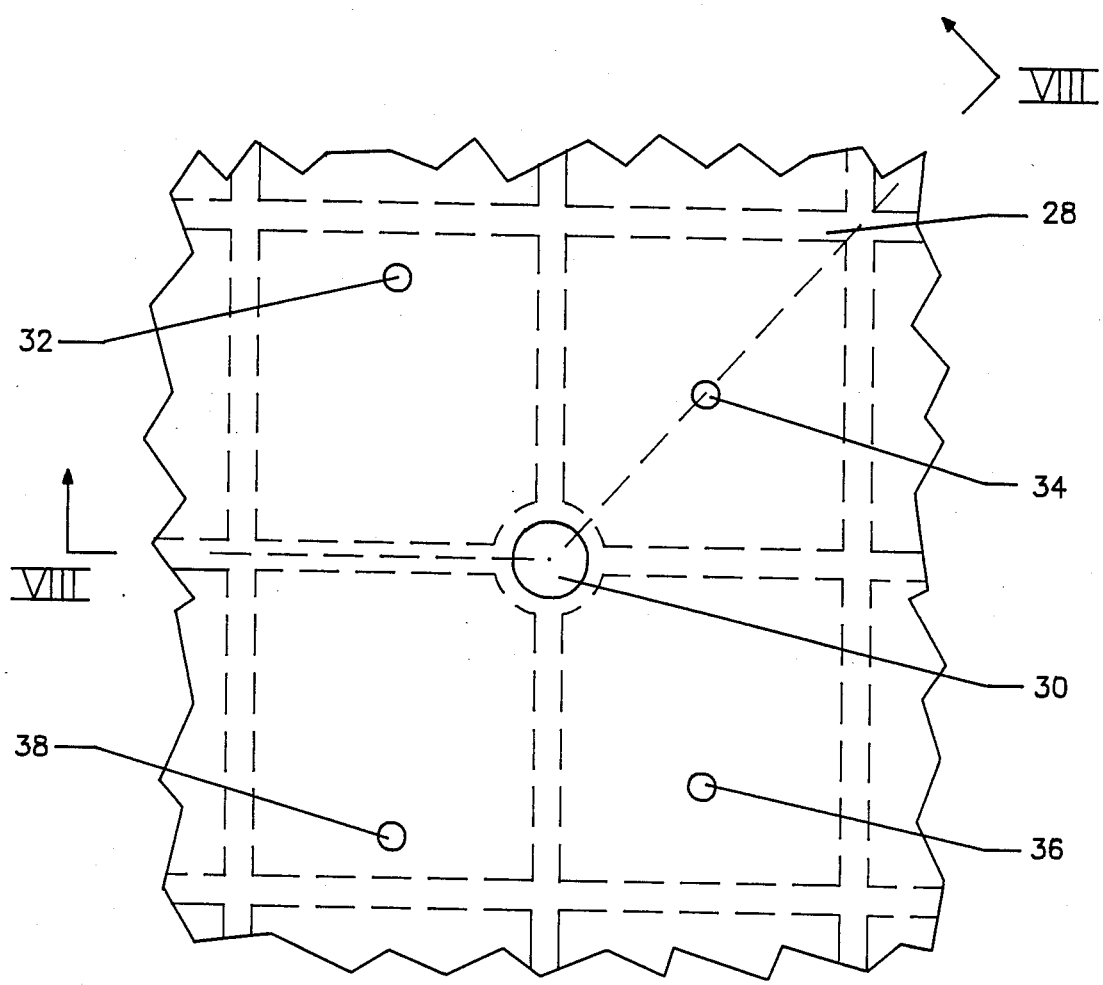
Figure 8:
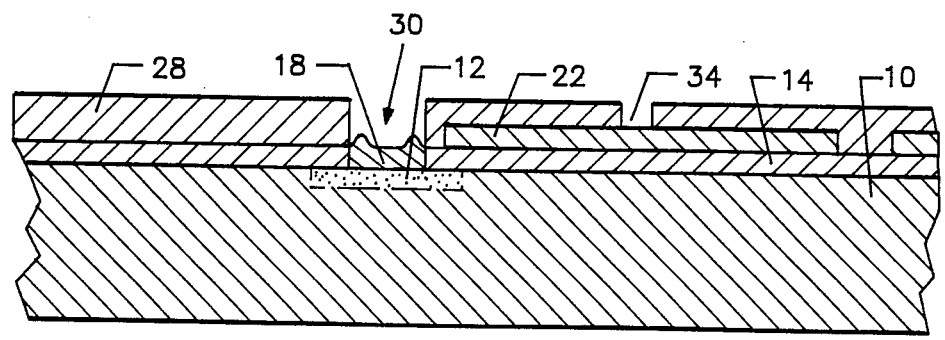
Figure 9:
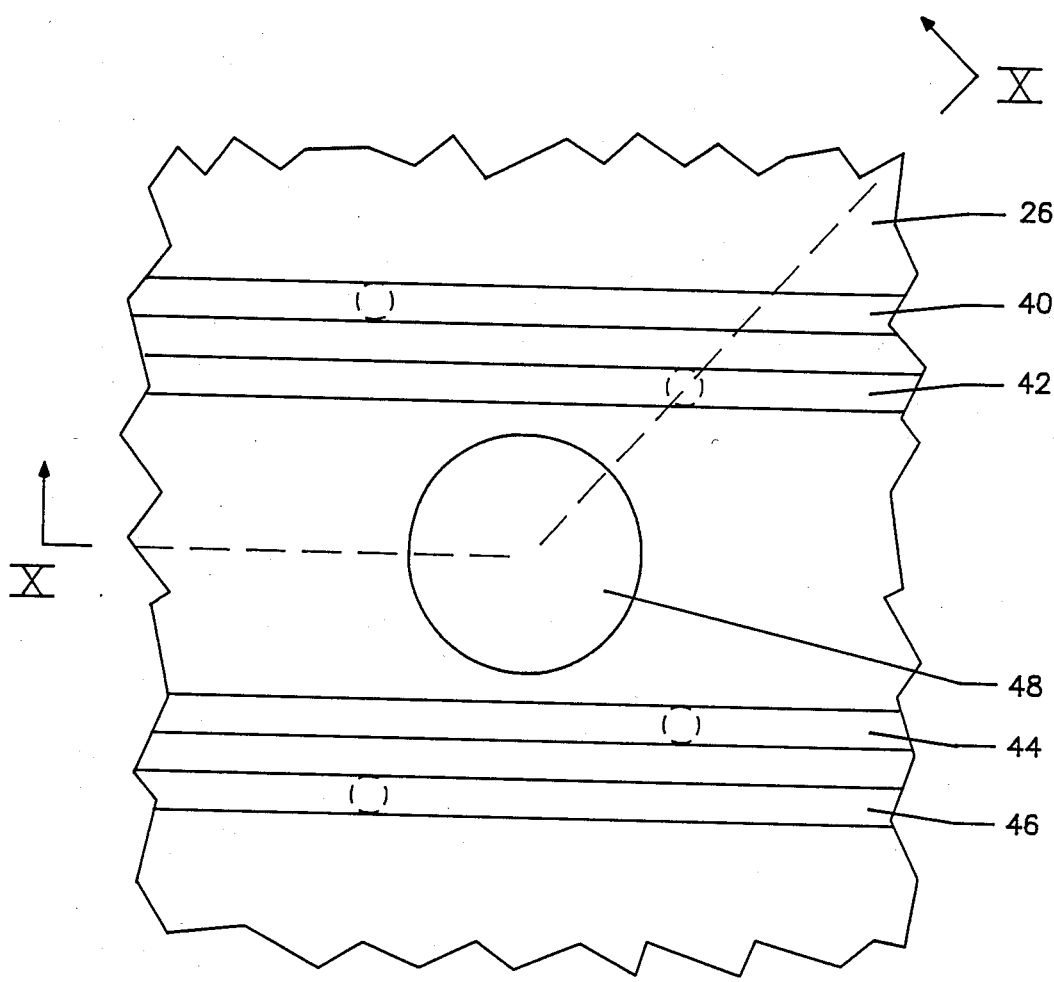
Figure 10:
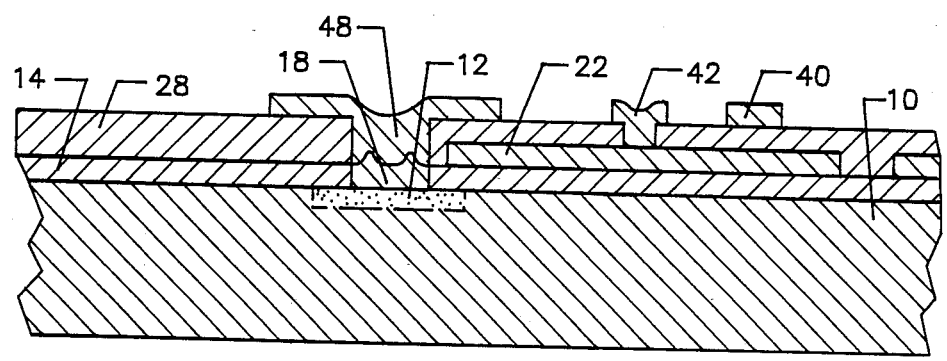

A second level of insulation 28 is deposited over the first level metal, as shown in FIGS. 7 and 8. The insulation 28 is removed over each junction region, as in the area 30, and over each conducting plate, as in the areas 32, 34, 36, and 38. Second level metal is then deposited, as shown in FIGS. 9 and 10, and a mask is used to etch the second level metal and define control lines and junction contacts. Control lines 40, 42, 44, and 46 contact corresponding conducting plates 20-26 in the areas 32-38. Junction contacts, such as the junction contact 48, contact the corresponding second level connecting metal over each junction region.

Figure 11:
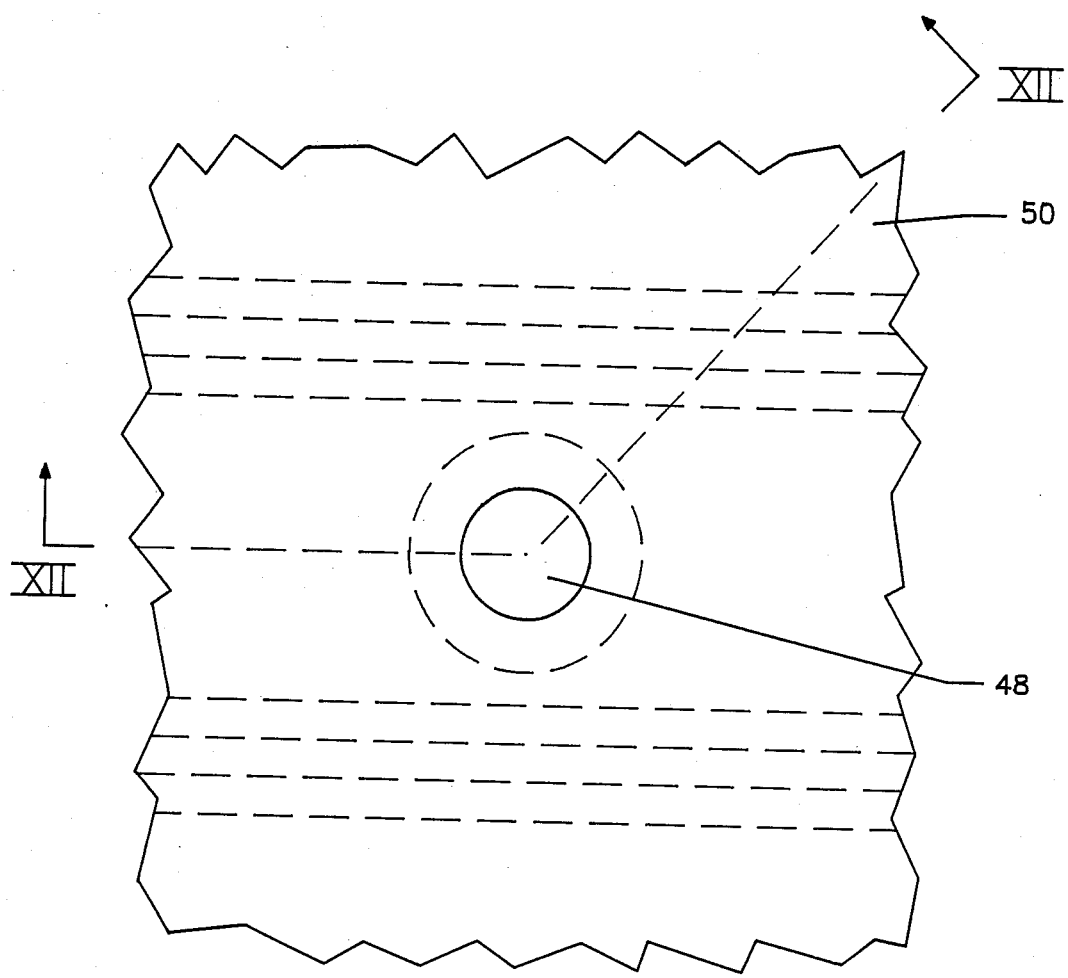
Figure 12:
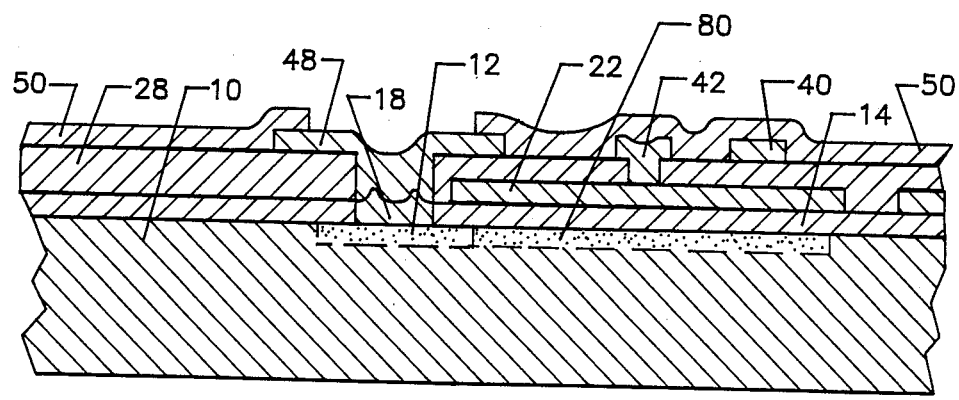

The detector array is then completed by depositing a third level of insulation 50, shown in FIGS. 11 and 12, over the junction contacts, the control lines, and the second level of insulation. The third level of insulation is removed over the junction contacts, such as contact 48, so that an interconnection can be made between the completed detector array and a multiplexing chip.

Figure 13:
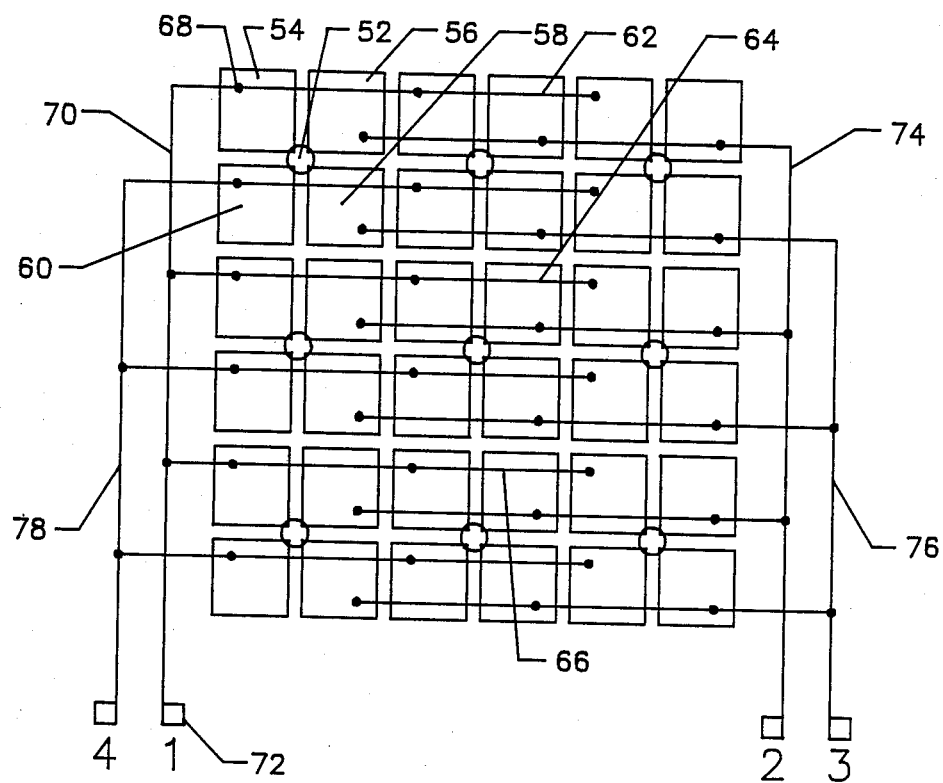
FIG. 13 is a schematic illustrating one possible arrangement for the control lines of the array shown in FIGS. 1-12.

A schematic illustrating one possible scheme for connecting the control lines of such a detector array is shown in FIG. 13. For ease of illustration, the array depicted here is a 6×6 detector array, with each four detectors being coupled to a common junction region, but those skilled in the art will appreciate that operational detector arrays will generally incorporate a much larger number of detectors. In the arrangement of FIG. 13, each junction region, such as the region 52, defines a unit cell with four induced junctions surrounding it, such as the induced junctions 54, 56, 58, and 60. Control lines 62, 64, and 66 are connected to the conducting plates in the first quadrant of each unit cell by control line contacts, such as the contact 68. The control lines are connected in turn to a first bus line 70 which terminates in a pad 72. Similarly, the conducting plates in quadrants 2, 3, and 4 of each cell are connected to second, third, and fourth lines 74, 76, and 78. In this manner, the detectors in each quadrant of the array can be selectively addressed, as further described below in connection with the operation of the detector array. This interconnect scheme requires no additional processing, since the bus lines may be defined at the same time as the control lines.

The processing of the detector is completed by adding interconnect bumps to each of the junction contacts, such as junction contact 48 in FIG. 12, and to each of the control line pads, such as pad 72 in FIG. 13. Corresponding interconnect bumps are located on the signal multiplexer chip. The focal plane is assembled by using a flip chip hybrid fabrication technique which results in the physical and electrical mating of the detector and multiplexer arrays, with a one-to-one match between respective interconnect sites.

In operation, light enters the detector through a transparent substrate (not shown) and is absorbed in the semiconductor layer 10, where the photons excite charges across the bandgap. The induced junctions, such as induced junction 80 in FIG. 12, detect the incoming radiation by collecting this excited charge. The collected charge is read out through the junction regions, such as junction region 12, and thence to the signal multiplexer through the junction contacts, such as the junction contact 48.

This invention provides a technique for achieving a small scale pre-multiplexing of the detector array while retaining a photovoltaic structure. In the center of each unit cell is a small junction, as in the junction region 52 shown in FIG. 13 or the junction region 12 shown in FIGS. 11 and 12. There are four MIS (metal-insulator-semiconductor) capacitors which surround and extend over each junction. These capacitors are formed by a combination of the semiconductor layer 10, the first level insulation 14, and the conducting plates, such as the plates 20-26 in FIGS. 11 and 12. Each of the four capacitors within a unit cell may be biased separately by means of the control lines, i.e., control lines 40-46 in FIGS. 11 and 12 or the bus lines 70 and 74-78 in conjunction with the control lines, such as lines 62-66, in FIG. 13. The signal multiplexer may be used to cause the correct signals to be placed on the control lines to perform this pre-multiplexing. By inverting any one of these capacitors, the central junction area may be extended into the corresponding quadrant of the unit cell. The control lines themselves do not form induced injunctions as readily, because they are located on a relatively thick layer of insulation which acts as a channel stop. Thus, by cycling the control lines to selectively create field induced junctions, such as the field induced junction 80 in FIG. 12, under each of the capacitors, the effective collection area for the incoming radiation will cycle about the unit cell. Consequently, the number of resolution elements on the focal plane is multiplied. In the embodiment illustrated, for example, the number of resolution elements is a factor of four higher than the number of unit cells. Where four induced junctions are provided per unit cell, one fourth of each frame time for the focal plane may be spent integrating the signal from each of the four quadrants, with the signal being transferred and read out after each integration time. Thus a 16 ms frame time would be composed of four separate 4 ms integration times with signal transfer. The readout of the signal from one quadrant may take place while the integration period has started for the next quadrant.

In the preferred embodiment, the detector design of this invention is used in conjunction with a charge coupled device (CCD) signal multiplexer, which receives the incoming signal charge by a direct injection circuit. Thus if the infrared diode is slightly reverse biased, the MIS capacitor will not be required to store charge, since the charge will be collected in the multiplexer as soon as it is generated. Therefore the bias on these capacitors may be kept low, eliminating tunnelling currents and minimizing thermal currents.

Figure 14:
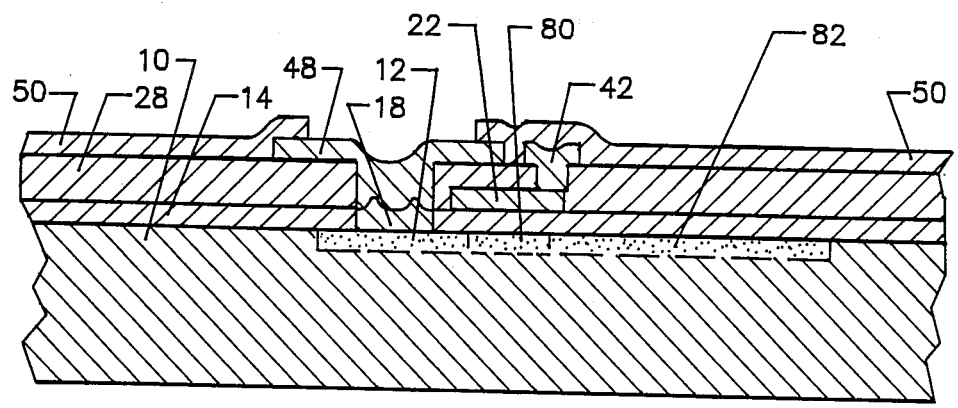
FIG. 14 is a cross-sectional side view, similar to FIG. 12, illustrating an alternative embodiment of the invention.

FIG. 14 is a cross-sectional side view similar to FIG. 12, but illustrating an alternative embodiment of a detector array built in accordance with the present invention. Here, the semiconducting layer 10, the junction region 12, the first level insulation 14, the contact 18, the second level of insulation 28, the control line 42, the junction contact 48, and the third level of insulation 50 are similar in structure and performance to the same elements in the embodiment illustrated in FIG. 12. The conducting plates, however, such as the plate 22, are reduced in size and are used to provide a connection between the junction region 12 and an auxiliary junction region, such as the region 82, formed in the layer 10. Where the layer 10 is p type HgCdTe, for example, the auxiliary junction regions, such as the region 82, would be doped to an n type conductivity, with the smaller induced junction regions, such as the region 80, being sequentially activated to read out charge from the auxiliary junction regions through the junction region 12.

Although some typical embodiments of the present invention have been illustrated and discussed above, modifications and additional embodiments of the invention will undoubtedly be apparent to those skilled in the art. The number of induced junctions surrounding each junction region, for example, may be varied to suit particular applications. In addition, the small scale multiplexing technique of this invention may also be implemented in other ways. If one uses only MIS capacitors, for example, they may be multiplexed in a similar manner, with the signal being read to the multiplexer using a direct-capacitively-coupled (DCC) detector/multiplexer interface. Changes may be made in the configurations, sizes, and arrangements of the components of the invention without departing from the scope of the invention. Furthermore, equivalent elements may be substituted for those illustrated and described herein, parts or connections might be reversed or otherwise interchanged, and certain features of the invention might be utilized independently of the use of other features. Consequently, the examples presented herein, which are provided to teach those skilled in the art how to construct the apparatus and perform the method of this invention, should be considered as illustrative only and not inclusive, the appended claims being more indicative of the full scope of the invention.

What is claimed is:

1. A detector array for sensing electromagnetic radiation, comprising:
   a semiconducting layer of a first conductivity type;
   an array of junction regions of a second conductivity type in said semiconducting layer;
   an insulating layer disposed on said semiconducting layer;
   a plurality of conducting plates disposed on said insulating layer around each junction region, each plate establishing, in conjunction with said insulating layer and said semiconducting layer, a capacitor for creating an induced junction region adjoining said junction region; and
   a plurality of control lines, each conducting plate being connected to a control line for selectively creating said induced junction regions.

2. The array of claim 1, further comprising a region of said second conductivity type in said semiconducting layer proximate to each induced junction region, said second conductivity type region establishing an auxiliary junction region such that each induced junction region connects an auxiliary junction region to said adjoining junction region.

3. The array of claim 1, further comprising a contact associated with each junction region for connecting said array to a multiplexer.

4. The array of claim 3, wherein said semiconducting layer further comprises HgCdTe.

5. The array of claim 4, wherein said HgCdTe layer exhibits a p type conductivity and said junction regions are doped to an n type conductivity.

6. The array of claim 4, wherein said HgCdTe layer exhibits an n type conductivity and said junction regions are doped to a p type conductivity.

7. A detector array for sensing electromagnetic radiation, comprising:
a semiconducting layer of a first conductivity type;
an array of junction regions of a second conductivity type in a major surface of said semiconducting layer;
a first insulating layer disposed over said major surface;
a plurality of conducting plates disposed on said first insulating layer around each junction region for creating, upon the application of an electrical potential between each plate and said semiconducting layer, an induced junction region in said semiconducting layer and adjoining said junction region;
a second insulating layer disposed over said conducting plates and said first insulating layer;
a contact through said first and second insulating layers associated with each junction region;
a plurality of control lines disposed over said second insulating layer, each conducting plate being connected to a control line for selectively applying said electrical potential to said plate;
a third insulating layer over said control lines, said contacts, and said second insulating layer; and
an opening through said third insulating layer over each of said contacts.

* * * * *